United States Patent
Lee et al.

(10) Patent No.: US 10,056,611 B2
(45) Date of Patent: Aug. 21, 2018

(54) METHOD FOR TESTING CYCLE LIFE OF POSITIVE ELECTRODE ACTIVE MATERIAL FOR SECONDARY BATTERY

(71) Applicant: LG Chem, Ltd., Seoul (KR)

(72) Inventors: Bo Ram Lee, Daejeon (KR); Ji Hye Kim, Daejeon (KR); Sun Sik Shin, Daejeon (KR); Wang Mo Jung, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/371,614

(22) Filed: Dec. 7, 2016

(65) Prior Publication Data

US 2017/0176543 A1 Jun. 22, 2017

(30) Foreign Application Priority Data

Dec. 18, 2015 (KR) ........................ 10-2015-0181741

(51) Int. Cl.
| | |
|---|---|
| *G01N 27/27* | (2006.01) |
| *H01M 4/485* | (2010.01) |
| *H01M 10/42* | (2006.01) |
| *G01R 31/36* | (2006.01) |
| *H01M 10/052* | (2010.01) |
| *H01M 4/02* | (2006.01) |

(52) U.S. Cl.
CPC ........ *H01M 4/485* (2013.01); *G01R 31/3637* (2013.01); *G01R 31/3641* (2013.01); *H01M 10/052* (2013.01); *H01M 10/4285* (2013.01); *H01M 2004/028* (2013.01)

(58) Field of Classification Search
CPC ............. H01M 4/485; H01M 10/4285; H01M 2004/028; G01R 31/3637; G01R 31/3641
USPC ........................................................ 324/426
See application file for complete search history.

(56) References Cited

U.S. PATENT DOCUMENTS

| | | | | |
|---|---|---|---|---|
| 6,586,940 | B2 * | 7/2003 | Asakura ............. | G01R 31/3679 324/426 |
| 8,928,286 | B2 * | 1/2015 | Amiruddin ....... | H01M 10/0525 320/130 |
| 2006/0113959 | A1 | 6/2006 | Honma | |
| 2013/0043843 | A1 * | 2/2013 | Amiruddin ........... | H01M 4/131 320/128 |
| 2016/0240858 | A1 * | 8/2016 | Yamada ............ | H01M 10/0568 |

FOREIGN PATENT DOCUMENTS

| | | |
|---|---|---|
| JP | H117985 A | 1/1999 |
| JP | 2006153663 A | 6/2006 |
| KR | 20150063254 A | 6/2015 |

* cited by examiner

*Primary Examiner* — Reena Aurora
(74) *Attorney, Agent, or Firm* — Lerner, David, Littenberg, Krumholz & Mentlik, LLP

(57) ABSTRACT

The present disclosure provides a method for testing a cycle life of a positive electrode active material for a secondary battery capable of predicting and assessing a cycle life of a positive electrode active material with high accuracy and excellent reliability in a short period of time using a simple method.

5 Claims, 2 Drawing Sheets

METHOD FOR TESTING CYCLE LIFE OF POSITIVE ELECTRODE ACTIVE MATERIAL FOR SECONDARY BATTERY

CROSS-REFERENCE TO RELATED APPLICATION(S)

The present application claims priority to and the benefits of Korean Patent Application No. 10-2015-0181741 filed with the Korean Intellectual Property Office on Dec. 18, 2015, the entire contents of which are incorporated herein by reference.

TECHNICAL FIELD

The present disclosure relates to a method for testing a cycle life of a positive electrode active material for a secondary battery capable of predicting and assessing a cycle life of a positive electrode active material with high accuracy and excellent reliability in a short period of time.

DESCRIPTION OF THE RELATED ART

With increases in technology developments and demands for mobile devices, demands for secondary batteries as an energy source have rapidly increased. Among such secondary batteries, lithium secondary batteries having high energy density and voltage, a long cycle life and a low self-discharge rate have been commercialized and widely used.

However, in lithium secondary batteries, active materials are degenerated due to moisture inside the battery, or electrolyte decomposition occurring during charge and discharge of the battery, or the like. In addition, with an increase in the internal resistance of the battery, a problem such as a rapid cycle life decrease occurs as charge and discharge are repeated. Particularly, such a problem is more serious at high temperatures.

Testing a cycle life of a battery cell is generally carried out after actually manufacturing the cell. As one example, after manufacturing a secondary battery cell, internal resistance of the cell is corrected by temperature and measured, and the cycle life of the battery is determined by comparing internal resistance corrected at the measured temperature and internal resistance data at a temperature set in advance. Another method is a method of determining a life cycle of a secondary battery used through repeating charge and discharge, and internal resistance in fixed battery capacity is measured when charged. By calculating the change in the internal resistance with the passage of time, the cycle life of the secondary battery is determined. As another method, there is a method of testing a cycle life of a battery by repeating a significant number of charge and discharge such as 300 cycles, 500 cycles or 1,000 cycles for a battery cell depending on the type of charge and discharge called constant current constant voltage (CC-CV).

As described above, existing cycle life tests for battery cells are carried out after manufacturing a cell of a secondary battery. However, when manufacturing a cell without clearly identifying positive electrode active material properties, target results are not obtained sometimes after carrying out the cycle life test, and the cell needs to be manufactured over again. In addition, long time of several months is taken for tests, and it is difficult to meet deadlines for new product development or delivery inspection.

Accordingly, when a cycle life property of such a cell is capable of being predicted in advance in a step of testing a positive electrode active material even without manufacturing an actual cell, efficient choice of a positive electrode active material becomes possible, and as a result, cost savings may be accomplished since the amount of cell manufacturing for actual tests is reduced.

DISCLOSURE OF THE INVENTION

Technical Problem

The present disclosure is to provide a method for testing a cycle life of a positive electrode active material for a secondary battery capable of predicting and assessing a cycle life of a positive electrode active material with high accuracy and excellent reliability in a short period of time.

Technical Solution

The present disclosure has been made in view of the above, and one embodiment of the present disclosure provides a method for testing a cycle life of a positive electrode active material for a secondary battery including preparing a positive electrode including a positive electrode active material for testing cycle life properties; preparing a half-cell using the positive electrode and a lithium negative electrode; repeating 5 cycles to 10 cycles with a charge and discharge process of charging the half-cell to 4.4 V to 4.5 V under a constant current condition, maintaining for 5 hours to 10 hours in a voltage range of 4.4 V to 4.5 V at 50° C. to 80° C., and discharging to 3.0 V under a constant voltage condition as 1 cycle, and measuring discharge capacity at each cycle; and calculating a discharge capacity retention rate at each cycle with respect to discharge capacity at the first cycle using the measured discharge capacity.

Other specifics of embodiments of the present disclosure are included in the detailed descriptions provided below.

Advantageous Effects

A method for testing a cycle life of a positive electrode active material for a secondary battery according to the present disclosure is capable of predicting and assessing a cycle life of a positive electrode active material with high accuracy and excellent reliability in a short period of time. Accordingly, cycle life properties of a cell can be readily predicted in a step of testing the positive electrode active material without manufacturing and directly testing the cell, which enables efficient choice of positive electrode active materials, and is also economically advantageous since cell manufacturing for actual tests is reduced.

BRIEF DESCRIPTION OF THE DRAWINGS

The following drawings accompanied in the present specification illustrate preferred embodiments of the present disclosure, and further enlighten technological ideas of the present disclosure together with the disclosure of the invention described above, and therefore, the present disclosure is not to be interpreted to be limited to the descriptions provided in the drawings.

MODE FOR CARRYING OUT THE INVENTION

Figure 1:
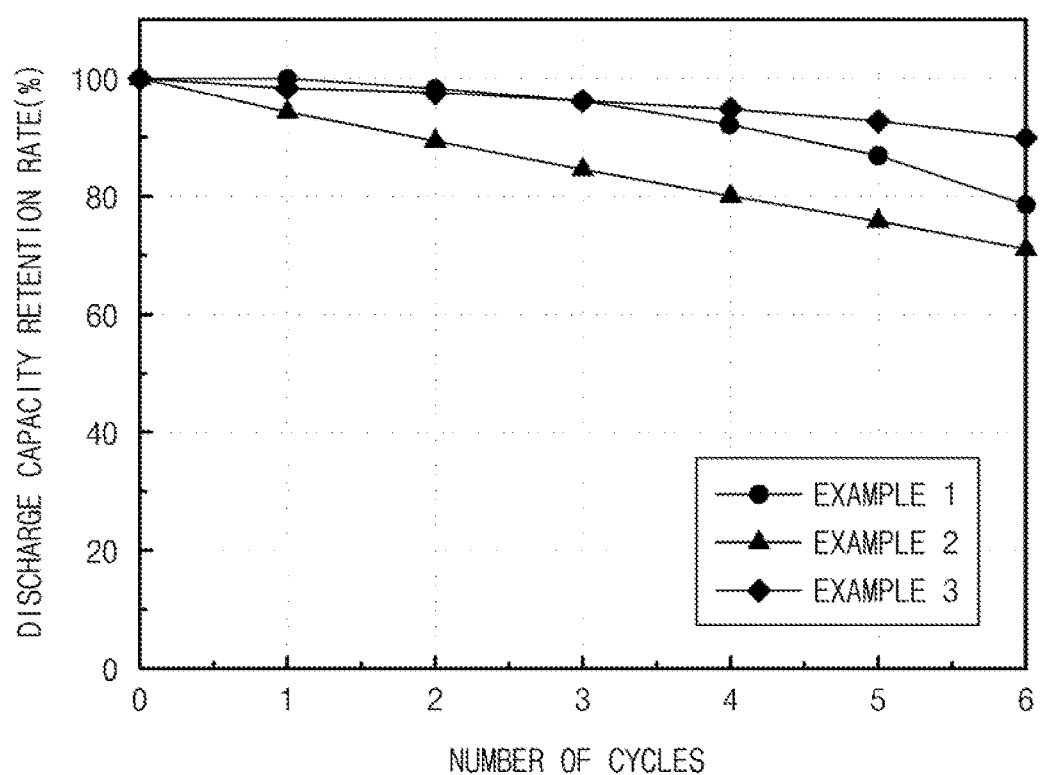
FIG. 1 shows results of testing a cycle life property of positive electrode active materials according to Example 1 to Example 3.

Hereinafter, the present disclosure will be described in more detail in order to illuminate the present disclosure.

Terms or words used in the present specification and the claims are not to be interpreted limitedly to common or dictionary meanings, and shall be interpreted as meanings and concepts corresponding to technological ideas of the present disclosure based on a principle in which the inventors may suitably define the concepts of terms in order to describe the invention in the best possible way.

A method for testing a cycle life of a positive electrode active material for a secondary battery according to one embodiment of the present disclosure includes, preparing a positive electrode including a positive electrode active material for testing a cycle life property (Step 1);

preparing a half-cell using the positive electrode and a lithium negative electrode (Step 2);

repeating 5 cycles to 10 cycles with a charge and discharge process of charging the half-cell to 4.4 V to 4.5 V under a constant current condition, maintaining for 5 hours to 10 hours in a voltage range of 4.4 V to 4.5 V at 50° C. to 80° C., and discharging to 3.0 V under a constant voltage condition as 1 cycle, and measuring discharge capacity at each cycle (Step 3); and calculating a discharge capacity retention rate at each cycle with respect to discharge capacity at the first cycle using the measured discharge capacity (Step 4).

Hereinafter, each step will be examined. First, Step 1 in the method for testing a cycle life of a positive electrode active material for a secondary battery according to one embodiment of the present disclosure is a step of preparing a positive electrode including a positive electrode active material for testing a cycle life property.

The positive electrode may be prepared using common positive electrode preparation methods except that an active material subject to a cycle life test is used as a positive electrode active material.

Specifically, the positive electrode may be prepared by coating a composition for forming a positive electrode active material prepared through dissolving or dispersing a positive electrode active material subject to a cycle life test, and selectively, a binder and a conductor in a solvent on a positive electrode current collector, and then drying and rolling the result.

The positive electrode active material is a compound capable of reversible lithium intercalation and deintercalation (lithiated intercalation compound), and specifically, may include materials having a hexagonal layered rock salt structure (specific examples thereof may include $LiCoO_2$, $LiCo_{1/3}Mn_{1/3}Ni_{1/3}O_2$ or $LiNiO_2$), materials having an olivine structure (specific examples thereof may include $LiFePO_4$), spinel materials having a cubic structure (specific examples thereof may include $LiMn_2O_4$), and in additions to these, vanadium oxides such as $V_2O_5$, and chalcogene compounds such as TiS or MoS.

More specifically, the positive electrode active material may be a lithium composite metal oxide including lithium and metals such as cobalt, manganese, nickel or aluminum. Specific examples of the lithium composite metal oxide may include lithium-manganese-based oxides (for example, $LiMnO_2$, $LiMn_2O$ and the like), lithium-cobalt-based oxides (for example, $LiCoO_2$ and the like), lithium-nickel-based oxides (for example, $LiNiO_2$ and the like), lithium-nickel-manganese-based oxides (for example, $LiNi_{1-Y1}Mn_{Y1}O_2$ (herein, 0<Y1<1), $LiMn_{2-z1}Ni_{z1}O_4$ (herein, 0<Z1<2) and the like), lithium-nickel-cobalt-based oxides (for example, $LiNi_{1-Y2}Co_{Y2}O_2$ (herein, 0<Y2<1) and the like), lithium-manganese-cobalt-based oxides (for example, $LiCo_{1-Y3}Mn_{Y3}O_2$ (herein, 0<Y3<1), $LiMn_{2-z2}Co_{z2}O_4$ (herein, 0<Z2<2) and the like), lithium-nickel-manganese-cobalt-based oxides (for example, $Li(Ni_{P1}Co_{Q1}Mn_{R1})O_2$ (herein, 0<P1<1, 0<Q1<1, 0<R1<1, P1+Q1+R1=1) or $Li(Ni_{P2}Co_{Q2}Mn_{R2})O_4$ (herein, 0<P2<2, 0<Q2<2, 0<R2<2, P2+Q2+R2=2) and the like), or lithium-nickel-cobalt-manganese-metal (M) oxides (for example, $Li(Ni_{P3}Co_{Q3}Mn_{R3}M_{S1})O_2$ (herein, M is selected from the group consisting of Al, Cu, Fe, V, Cr, Ti, Zr, Zn, Ta, Nb, Mg, B, W and Mo, and P3, Q3, R3 and S1 are each an atomic fraction of independent elements, and 0<P3<1, 0<Q3<1, 0<R3<1, 0<S1<1, P3+Q3+R3+S1=1) and the like) and the like, and among these, any one, or two or more compounds may be used.

In addition, in the lithium composite metal oxide, at least one of metal elements other than lithium may be doped with any one, or two or more elements selected from the group consisting of Al, Cu, Fe, V, Cr, Ti, Zr, Zn, Ta, Nb, Mg, B, W and Mo. When the lithium composite metal oxide is further doped with the above-mentioned metal elements as described above, structural stability of the positive electrode active material is improved. As a result, battery output properties may be enhanced. Herein, the content of the doping elements included in the lithium composite metal oxide may be properly controlled in a range that does not decline properties of the positive electrode active material. Specifically, the content may be 1 atomic % or less, and more specifically, 0.02 atomic % or less.

More specifically, when considering that the method for testing a cycle life of a positive electrode active material according to the present disclosure is carried out under a severe condition of high temperature and high voltage, cycle life property test results with more accuracy and high reliability may be obtained without concern for degeneration of the positive electrode active material itself. Accordingly, the positive electrode active material may be a layer-structured lithium composite metal oxide that is not doped or is doped with any one, or two or more elements selected from the group consisting of Al, Cu, Fe, V, Cr, Ti, Zr, Zn, Ta, Nb, Mg, B, W and Mo. More specifically, the positive electrode active material is a layer-structured lithium cobalt oxide that is not doped or is doped with the above-mentioned doping elements.

Specifically, the lithium composite metal oxide may include a compound of the following Chemical Formula 1.

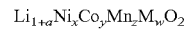

$Li_{1+a}Ni_xCo_yMn_zM_wO_2$  [Chemical Formula 1]

(In Chemical Formula 1, M may include any one, or two or more elements selected from the group consisting of Al, Cu, Fe, V, Cr, Ti, Zr, Zn, Ta, Nb, Mg, B, W and Mo, and a, x, y, z and w are each independently an atomic fraction of the corresponding elements and may be −0.5≤a≤0.5, 0≤x≤1, 0<y≤1, 0≤z≤1, 0≤w≤1 and 0<x+y+z≤1)

In addition, at least one or more of a conductor and a binder may be selectively further used when preparing the composition for forming a positive electrode active material layer.

The conductor is used for providing conductivity to the electrode, and in the battery, is not particularly limited as long as it has electron conductivity without inducing chemical changes. Specific examples thereof may include graphite such as natural graphite or artificial graphite; carbon-based materials such as carbon black, acetylene black, Ketjen black, channel black, furnace black, lamp black, thermal black and carbon fiber; metal powder such as copper, nickel, aluminum and silver, or metal fiber; conductive whiskers such as zinc oxide and potassium titanate; conductive metal oxides such as titanium oxide; or conductive polymers such as polyphenylene derivatives, and these may be used either alone or as a mixture of two or more types. The conductor may be included in 1% by weight to 30% by weight with respect to the total weight of the positive electrode active material layer.

In addition, the binder performs a role of enhancing adhesion between the positive electrode active material particles and adhesive strength between the positive electrode active material and the current collector. Specific examples thereof may include polyvinylidene fluoride (PVDF), a vinylidene fluoride-hexafluoropropylene copolymer (PVDF-co-HFP), polyvinyl alcohol, polyacrylonitrile, carboxymethyl cellulose (CMC), starch, hydroxypropyl cellulose, regenerated cellulose, polyvinyl pyrrolidone, tetrafluoroethylene, polyethylene, polypropylene, an ethylene-propylene-diene monomer (EPDM), a sulfonated EPDM, styrene-butadiene rubber (SBR), fluorine rubber, or various copolymers thereof. These may be used either alone or as a mixture of two or more types. The binder may be included in 1% by weight to 30% by weight with respect to the total weight of the positive electrode active material layer.

In addition, solvents generally used in the art may be used as the solvent for dissolving or dispersing the conductor and the binder as well as the positive electrode active material when preparing the composition for forming a positive electrode active material layer, and specific examples thereof may include dimethyl sulfoxide (DMSO), isopropyl alcohol, N-methyl-pyrrolidone (NMP), acetone, water or the like. These may be used either alone or as a mixture of two or more types. The amount of the solvent used is sufficient when the amount is capable of dissolving or dispersing the positive electrode active material, the conductor and the binder considering slurry coating thickness and preparation yield, and the slurry has viscosity to exhibit excellent thickness uniformity when coated for preparing the positive electrode thereafter.

Meanwhile, the positive electrode current collector is not particularly limited as long as it has high conductivity without inducing chemical changes in the battery, and examples thereof may include stainless steel, aluminum, nickel, titanium, baked carbon, or aluminum or stainless steel of which surface is treated with carbon, nickel, titanium, silver or the like. In addition, the positive electrode current collector may have a thickness of 3 µm to 500 µm, and adhesive strength of the positive electrode active material may be enhanced by forming fine unevenness on the surface of the current collector. For example, various forms such as films, sheets, foil, nets, porous bodies, foams and non-woven fabrics may be used.

In addition, as another method, the positive electrode may be prepared by casting the composition for forming a positive electrode active material layer on a separate support, and then laminating a film obtained from being peeled off from this support on the positive electrode current collector. Herein, the support may be used with particular limit as long as it has a releasing property so as to readily peel off the positive electrode active material layer such as a releasing polymer film.

Next, Step 2 in the method for testing a cycle life of a positive electrode active material for a secondary battery according to one embodiment of the present disclosure is a step of preparing a half-cell using the positive electrode prepared in Step 1 and a lithium negative electrode.

The half-cell may be prepared using common methods except that the positive electrode prepared in Step 1 is used, and a lithium negative electrode is used as a counter electrode for the positive electrode. In addition, the shape of the half-cell is not particularly limited, and specifically, a coin half-cell may be used.

Specifically, the separator in the preparation of the half-cell separates the negative electrode and the positive electrode and provides a lithium ion migration path, and is not particularly limited as long as it is used as a separator in common lithium secondary batteries, and particularly, separators having an excellent liquid electrolyte moisture permeating ability while having low resistance for electrolyte ion migration are preferred. Specifically, porous polymer films, for example, porous polymer films prepared with polyolefin-based polymers such as ethylene homopolymers, propylene homopolymers, ethylene/butene copolymers, ethylene/hexene copolymers and ethylene/methacrylate copolymers, or laminated structures of two or more layers thereof, may be used. In addition, common porous non-woven fabrics, for example, non-woven fabrics made of high melting point glass fiber, polyethylene terephthalate fiber or the like may be used. In addition, coated separators including ceramic components or polymer materials may also be used for securing heat resistance or mechanical strength, and selectively, the separator may be used in single layer or multilayer structures.

As the electrolyte, organic-based liquid electrolytes, inorganic-based liquid electrolytes, solid polymer electrolytes, gel-type polymer electrolytes, solid inorganic electrolytes, molten-type inorganic electrolytes and the like capable of being used in manufacturing lithium secondary batteries may be used, however, the electrolyte is not limited thereto.

Specifically, the electrolyte may include an organic solvent and a lithium salt.

The organic solvent may be used without particular limit as long as it is capable of performing a role of a medium in which ions participating in a battery electrochemical reaction are capable of migrating. Specific examples of the organic solvent may include ester-based solvents such as methyl acetate, ethyl acetate, γ-butyrolactone or ε-caprolactone; ether-based solvents such as dibutyl ether or tetrahydrofuran; ketone-based solvents such as cyclohexanone; aromatic hydrocarbon-based solvents such as benzene and fluorobenzene; carbonate-based solvents such as dimethyl carbonate (DMC), diethyl carbonate (DEC), methyl ethyl carbonate (MEC), ethyl methyl carbonate (EMC), ethylene carbonate (EC) or propylene carbonate (PC); alcohol-based solvents such as ethyl alcohol and isopropyl alcohol; nitriles such as R—CN (R is a C2 to C20 linear, branched or cyclic hydrocarbon group, and may include double bond aromatic rings or ether bonds); amides such as dimethylformamide; dioxolanes such as 1,3-dioxolane; sulfolanes, or the like. Among these, the electrolyte may include a carbonate-based solvent, and more specifically, may include a mixture of cyclic carbonate (for example, ethylene carbonate, propylene carbonate or the like) and linear carbonate-based compounds (for example, ethylmethyl carbonate, dimethyl carbonate, diethyl carbonate or the like), and even more specifically, may include a mixture mixing cyclic carbonate and chain carbonate in a volume ratio of 1:1 to 1:9.

In addition, the lithium salt may be used without particular limit as long as it is a compound capable of providing lithium ions used in lithium secondary batteries. Specific examples of the lithium salt may include $LiPF_6$, $LiClO_4$, $LiAsF_6$, $LiBF_4$, $LiSbF_6$, $LiAlO_4$, $LiAlCl_4$, $LiCF_3SO_3$, $LiC_4F_9SO_3$, $LiN(C_2F_5SO_3)_2$, $LiN(C_2F_5SO_2)_2$, LiN $(CF_3SO_2)_2$, LiCl, LiI, $LiB(C_2O_4)_2$ or the like. The lithium salt is favorably used in a concentration range of 0.1 M to 2.0 M. When the lithium salt concentration is in the above-mentioned range, the electrolyte has proper conductivity and viscosity, and therefore, may exhibit excellent electrolyte properties, and lithium ions may effectively migrate.

Next, Step 3 in the method for testing a cycle life of a positive electrode active material for a secondary battery according to one embodiment of the present disclosure is a step of measuring discharge capacity at each cycle for the half-cell prepared in Step 2.

In the measuring of discharge capacity, charge and discharge are carried out under a high temperature and high pressure condition more severe than in common operations of secondary batteries so that the positive electrode active material is quickly degenerated in a range that does not damage the positive electrode active material and the half-cell including the same.

Specifically, the measuring of discharge capacity may be carried out by repeating 5 cycles to 10 cycles with a charge and discharge process of charge-maintain-discharge including processes of charging the half-cell to 4.4 V to 4.5 V under a constant current condition; maintaining for 5 hours to 10 hours in a voltage range of 4.4 V to 4.5 V at 50° C. to 80° C.; and discharging to 3.0 V under a constant voltage condition as 1 cycle, and measuring discharge capacity at each cycle.

More specifically, the charge process may be carried out under a constant current condition of 0.2 C to 0.5 C. Even more specifically, the charge process may be carried out under a constant current condition of 0.2 C.

The maintaining process after the charging is for accelerating degeneration of the positive electrode material under a severe condition. When the maintaining process is not carried out, the rate of degeneration is low, and an effect of shortening the time of testing a cycle life property is difficult to obtain.

More specifically, the maintaining process may be carried out for 8 hours to 10 hours in a voltage range of 4.45 V to 4.5 V at 60° C. to 70° C., and even more specifically, may be carried out for 10 hours at a voltage of 4.45 V at 70° C.

The number of times of the charge and discharge process including processes of charge-maintain-discharge as above may be properly determined depending on the types of the positive electrode active material subject to test. Specifically, 5 cycles to 10 cycles may be carried out. More specifically, 5 cycles to 8 cycles may be carried out when considering concern for degeneration of the positive electrode active material caused by driving under high temperature and high voltage.

Even more specifically, the measuring of discharge capacity may be carried out by repeating 5 cycles to 8 cycles with a charge and discharge process of charge-maintain-discharge including processes of charging the half-cell to 4.4 V to 4.5 V under a constant current condition of 0.2 C; maintaining for 10 hours at a voltage of 4.45 V at 70° C.; and discharging to 3.0 V under a constant voltage condition as 1 cycle, and measuring discharge capacity at each cycle.

Next, Step 4 in the method for testing a cycle life of a positive electrode active material for a secondary battery according to one embodiment of the present disclosure is a step of calculating a discharge capacity retention rate at each cycle with respect to discharge capacity at the first cycle using the measured discharge capacity.

Discharge capacity retention rate calculation at each cycle may be carried out using common discharge capacity retention rate calculation methods.

As described above, the method for testing a cycle life of a positive electrode active material according to one embodiment of the present disclosure may predict and assess a life cycle of a positive electrode active material with high accuracy and excellent reliability in a short period of time by accelerating degeneration of the positive electrode active material using a method of maintaining for a certain period of time at high temperature and high voltage. Accordingly, cycle life properties of a cell may be readily predicted in a step of testing a positive electrode active material without manufacturing and directly testing the cell, which enables efficient choice of positive electrode active materials, and is also economically advantageous since cell manufacturing for actual tests is reduced.

Hereinafter, examples of the present disclosure will be described in detail so as for those skilled in the art to readily carry out the present disclosure. However, the present disclosure may be implemented into various different forms, and is not limited to the examples described herein.

Preparation Example 1-1 to Preparation Example
1-3: Preparation of Positive Electrode A positive electrode active material, a conductor and a binder listed in Table 1 subject to a cycle life property test were mixed in a weight ratio of 90:5:5. The result was mixed with N-methylpyrrolidone, a solvent, to prepare a composition for forming a positive electrode (viscosity: 5,000 mPa·s). The composition for forming a positive electrode was coated on an aluminum current collector, and the result was dried at 130° C. and rolled to prepare a positive electrode.

TABLE 1

| Category | Positive Electrode Active Material | | | Conductor | Binder |
|---|---|---|---|---|---|
| | Lithium Composite Metal Oxide | Doping Element | | | |
| | | Mg (ppm) | Al (ppm) | | |
| Preparation Example 1-1 | $LiCoO_2$ | 900 | 500 | Carbon Black | PVdF |
| Preparation Example 1-2 | $LiCoO_2$ | — | 500 | Carbon Black | PVdF |
| Preparation Example 1-3 | $LiCoO_2$ | — | 300 | Carbon Black | PVdF |

Preparation Example 2-1 to Preparation Example
2-3: Preparation of Half-Cell

An electrode assembly was prepared by providing a separator between a positive electrode and a lithium negative electrode listed in the following Table 2. The electrode assembly was placed inside a case, and a liquid electrolyte was injected to the inside of the case to prepare a half-cell. Herein, the liquid electrolyte was prepared by dissolving lithium hexafluorophosphate ($LiPF_6$) having a concentration of 1.0 M in an organic solvent formed with ethylene carbonate/dimethyl carbonate/ethyl methyl carbonate (mixed volume ratio of EC/DMC/EMC=3/4/3).

TABLE 2

| Category | Positive Electrode | Negative Electrode | Separator |
|---|---|---|---|
| Preparation Example 2-1 | Preparation Example 1-1 | Li Thin Film | Porous Polyethylene |
| Preparation Example 2-2 | Preparation Example 1-2 | | |
| Preparation Example 2-3 | Preparation Example 1-3 | | |

Comparative Preparation Example 2-1 to Comparative Preparation Example 2-3: Manufacture of Lithium Secondary Battery A negative electrode active material, carbon black and a binder listed in the following Table 3 were mixed in a weight ratio of 85:10:5. The result was mixed with an N-methylpyrrolidone solvent to prepare a composition for forming a negative electrode. The composition for forming a negative electrode was coated on a copper current collector to prepare a negative electrode.

An electrode assembly was prepared by providing a separator between a positive electrode and a negative electrode listed in the following Table 3. The electrode assembly was placed inside a square battery case, and a liquid electrolyte was injected to the inside of the case to prepare a lithium secondary battery. Herein, the liquid electrolyte was prepared by dissolving lithium hexafluorophosphate (LiPF$_6$) having a concentration of 1.15 M in an organic solvent formed with ethylene carbonate/dimethyl carbonate/ethyl methyl carbonate (mixed volume ratio of EC/DMC/EMC=3/4/3).

TABLE 3

| | | Negative Electrode | | | |
|---|---|---|---|---|---|
| Category | Positive Electrode | Negative Electrode Active Material | Conductor | Binder | Separator |
| Comparative Preparation Example 2-1 | Preparation Example 1-1 | MCMB (Mesocarbon Microbead) | Carbon Black | PVdF | Porous Polyethylene |
| Comparative Preparation Example 2-2 | Preparation Example 1-2 | | | | |
| Comparative Preparation Example 2-3 | Preparation Example 1-3 | | | | |

Example 1 to Example 3: Evaluation on Half-Cell Properties

The half-cells of Preparation Example 2-1 to Preparation Example 2-3 were charged to 4.45V under a constant current condition of 0.2 C. After that, the half-cells were maintained for 10 hours at a voltage of 4.45 V at 70° C. and then discharged to 3.0 V under a constant voltage condition. With a charge and discharge process including the above-mentioned charge and discharge as 1 cycle, 6 cycles were repeated, and discharge capacity at each cycle was measured. A discharge capacity retention rate at each cycle with respect to discharge capacity at the first cycle using the measured discharge capacity is calculated. The results are shown in FIG. 1.

Comparative Example 1 to Comparative Example 3: Evaluation on Lithium Secondary Battery Properties The lithium secondary batteries of Comparative Preparation Example 2-1 to Comparative Preparation Example 2-3 were charged to 4.4 V under a constant current condition of 0.8 C, and then maintained for 24 hours at a voltage of 4.4 V at 40° C. and discharged to 3.0 V under a constant voltage condition. With a charge and discharge process including the above-mentioned charge and discharge as 1 cycle, 120 cycles were repeated, and discharge capacity at each cycle was measured. A discharge capacity retention rate at each cycle with respect to discharge capacity at the first cycle using the measured discharge capacity is calculated. The results are shown in FIG. 2.

Figure 2:
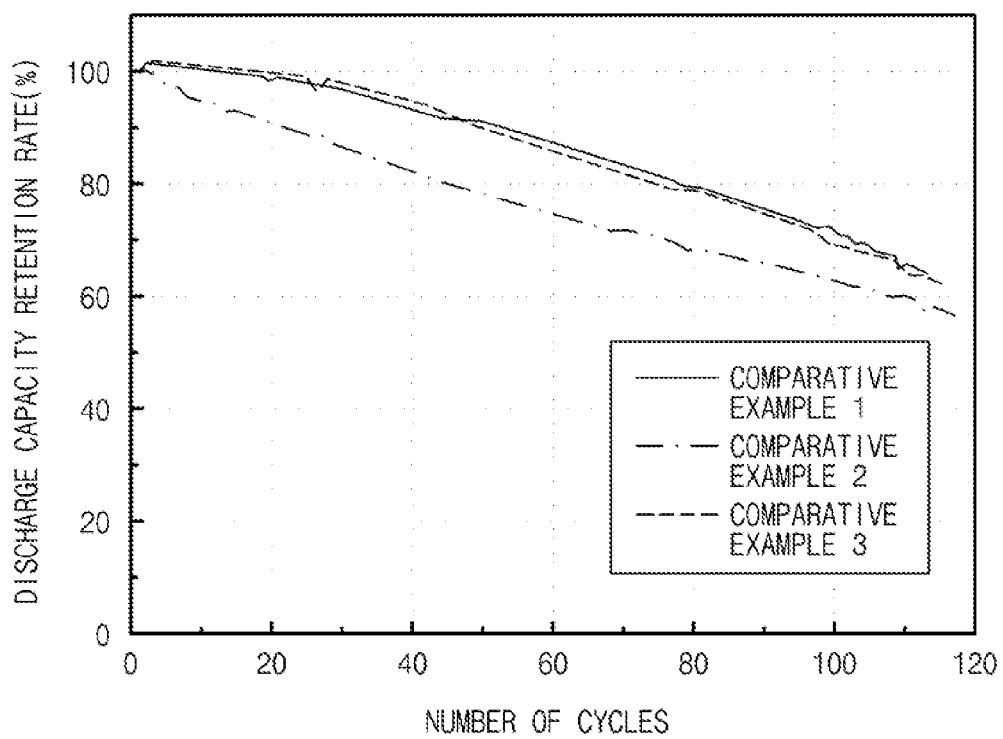
FIG. 2 shows results of testing a cycle life property of battery cells according to Comparative Example 1 to Comparative Example 3.

When referring to FIG. 1 to FIG. 3, cycle life properties with similar trends were able to be identified in a significantly shorter period of time when testing a cycle life of the positive electrode active material using the methods according to Example 1 to Example 3. From such results, it can be seen that positive electrode active materials having excellent cycle life properties are capable of being readily predicted prior to manufacturing actual cells when carrying out tests using the methods according to the present disclosure.

What is claimed is:

1. A method for testing a cycle life of a positive electrode active material for a secondary battery comprising:
    (a) preparing a half-cell having a positive electrode and a negative electrode, wherein the positive electrode includes a positive electrode active material and the negative electrode includes lithium;
    (b) charging the half-cell to 4.4 V to 4.5 V under a constant current condition, maintaining the half-cell for 5 hours to 10 hours in a voltage range of 4.4 V to 4.5 V at 50° C. to 80° C., and discharging the half-cell to 3.0 V under a constant voltage condition to complete a charge/discharge cycle, and measuring discharge capacity of the charge/discharge cycle;
    (c) repeating step (b) for 5 to 10 charge/discharge cycles; and
    (d) calculating a discharge capacity retention rate at each charge/discharge cycle with respect to discharge capacity at the first charge/discharge cycle using the measured discharge capacity at each charge/discharge cycle.

2. The method for testing a cycle life of a positive electrode active material for a secondary battery of claim 1, wherein the charging step in each charge/discharge cycle is carried out under a constant current condition of 0.2 C to 0.5 C.

3. The method for testing a cycle life of a positive electrode active material for a secondary battery of claim 1, wherein the maintaining step in each charge/discharge cycle is carried out for 8 hours to 10 hours in a voltage range of 4.45 V to 4.5 V at 60° C. to 70° C.

4. The method for testing a cycle life of a positive electrode active material for a secondary battery of claim 1, wherein the positive electrode active material includes a lithium composite metal oxide having layered structure.

5. The method for testing a cycle life of a positive electrode active material for a secondary battery of claim 4, wherein the lithium composite metal oxide is doped with any one, or two or more elements selected from the group consisting of Al, Cu, Fe, V, Cr, Ti, Zr, Zn, Ta, Nb, Mg, B, W and Mo.

* * * * *